(12) United States Patent
Liu

(10) Patent No.: US 11,145,684 B2
(45) Date of Patent: Oct. 12, 2021

(54) ARRAY SUBSTRATE, LIQUID CRYSTAL PANEL AND LIQUID CRYSTAL DISPLAY DEVICE

(71) Applicant: Wuhan China Star Optoelectronics Technology Co., Ltd., Hubei (CN)

(72) Inventor: Yuanfu Liu, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 508 days.

(21) Appl. No.: 16/076,220

(22) PCT Filed: May 10, 2018

(86) PCT No.: PCT/CN2018/086303
§ 371 (c)(1),
(2) Date: Aug. 7, 2018

(87) PCT Pub. No.: WO2019/119714
PCT Pub. Date: Jun. 27, 2019

(65) Prior Publication Data
US 2021/0082971 A1  Mar. 18, 2021

(30) Foreign Application Priority Data
Dec. 22, 2017 (CN) .......................... 201711407687.0

(51) Int. Cl.
*H01L 27/12* (2006.01)
*G02F 1/1345* (2006.01)
*G02F 1/1368* (2006.01)

(52) U.S. Cl.
CPC ...... *H01L 27/1255* (2013.01); *G02F 1/13454* (2013.01); *H01L 27/1248* (2013.01); *G02F 1/1368* (2013.01)

(58) Field of Classification Search
None
See application file for complete search history.

(56) References Cited

U.S. PATENT DOCUMENTS

| 2001/0022365 A1* | 9/2001 | Murade | H01L 27/1255 257/59 |
| 2016/0027858 A1* | 1/2016 | Kim | H01L 27/3262 257/40 |
| 2016/0372497 A1* | 12/2016 | Lee | H01L 27/1222 |

FOREIGN PATENT DOCUMENTS

| CN | 104465675 A | 3/2015 |
| CN | 105487315 | 4/2016 |

(Continued)

OTHER PUBLICATIONS

English translation of CN-106200167-A, Title: Array substrate and liquid crystal displayer, Author: Ma Liang ; Date of publication: Dec. 7, 2016 (Year: 2016).*

*Primary Examiner* — Shan Liu
(74) *Attorney, Agent, or Firm* — Leong C. Lei

(57) ABSTRACT

An array substrate is disclosed. The array substrate includes a semiconductor active layer, a gate insulation layer, a first metal layer, an interlayer dielectric layer, a second metal layer, a planarization layer and a passivation layer sequentially disposed on a base substrate; wherein the array substrate is provided with a row driving unit, including a capacitor structure; wherein the capacitor structure includes a first capacitive plate formed in the semiconductor active layer, a second capacitive plate formed in the first metal layer and a third capacitive plate formed in the second metal layer; and wherein projections of the first capacitive plate and the second capacitive plate on the base substrate are partially overlapped, projections the second capacitive plate and the third capacitive plate on the base substrate are partially overlapped and the third capacitive plate is elec- (Continued)

trically connected to the first capacitive plate through a first via hole.

14 Claims, 4 Drawing Sheets

(56) References Cited

FOREIGN PATENT DOCUMENTS

| | | | |
|---|---|---|---|
| CN | 105977261 | | 9/2016 |
| CN | 105988258 | | 10/2016 |
| CN | 106200167 | | 12/2016 |
| CN | 106200167 A | * | 12/2016 |
| CN | 106257677 | | 12/2016 |

* cited by examiner

ARRAY SUBSTRATE, LIQUID CRYSTAL PANEL AND LIQUID CRYSTAL DISPLAY DEVICE

RELATED APPLICATIONS

The present application is a National Phase of International Application Number PCT/CN2018/086303, filed May 10, 2018, and claims the priority of China Application No. 201711407687.0, filed Dec. 22, 2017.

FIELD OF THE INVENTION

The present invention relates to the display technology field, and more particularly to an array substrate, a liquid crystal panel and a liquid crystal display device including the array substrate.

BACKGROUND OF THE INVENTION

A Liquid Crystal Display (LCD) device has advantages such as thinness and low power consumption, and has become a mainstream of displays. The liquid crystal display device generally includes a liquid crystal panel and a backlight module. The structure of the liquid crystal panel is mainly composed of a Thin Film Transistor Array (TFT Array) substrate, a Color Filter (CF) substrate, and a liquid crystal layer formed between the two substrates. The principle of operation is to control the rotation of the liquid crystal molecules of the liquid crystal layer by applying a driving voltage to the two glass substrates, and the light of the backlight module is refracted to generate a picture.

With the development of liquid crystal display technology, more and more liquid crystal display devices use a gate driver on array (GOA) technology to reduce the border width of the array substrate to meet the requirement of the narrow frame design trend of the liquid crystal display device.

A common GOA circuit unit formed by multiple thin-film transistors and capacitors. The capacitor in the GOA circuit unit generally includes a first capacitive plate, an insulating layer, and a second capacitive plate which are sequentially disposed. The first capacitive plate is parallel to the second capacitive plate and has a relatively overlapping portion to form a capacitor structure. As shown in FIG. 1, a conventional array substrate with a GOA circuit unit includes a poly-silicon layer 2, a gate insulating layer 3, a gate metal layer 4, and an interlayer dielectric layer 5 and a planarization layer sequentially formed on a base substrate 1. Wherein a first capacitive plate 2a is patterned in the poly-silicon layer 2, a second capacitive plate 4a is formed in the gate metal layer 4, and the first capacitive plate 2a and the second capacitive plate are overlapped with each other and spaced by the gate insulating layer 3 to form a capacitor in the GOA circuit unit, the capacitance value of which is $C_0 = \varepsilon \times S/d$, wherein $\varepsilon$ the permittivity of the gate insulating layer 3, and S is an overlapped area of the first capacitive plate 2a and the second capacitive plate 4a, d is the vertical distance between the first capacitive plate 2a and the second capacitive plate 4a.

In order to obtain a stable output signal for the GOA circuit unit, it must be ensured that the capacitor has a sufficiently large capacitance value. In the capacitor structure of the array substrate shown in FIG. 1, referring to the calculation formula of the capacitance value $C_0$ as described above, in the case where the material and the thickness of the gate insulating layer 3 cannot be changed, the only way to increase the capacitance value is to increase areas of the first capacitive plate 2a and the second capacitive plate 4a, which is not conducive to the narrow frame design.

SUMMARY OF THE INVENTION

In view of this, the present invention provides an array substrate, which can reduce an area occupied by a row driving unit (GOA) on an array substrate, and is advantageous for implementing a narrow frame design of a display device.

In order to achieve the above object, the present invention adopts the following technical solutions: an array substrate, comprising: a semiconductor active layer, a gate insulation layer, a first metal layer, an interlayer dielectric layer, a second metal layer, a planarization layer and a passivation layer which are sequentially disposed on a base substrate; wherein the array substrate is provided with a row driving unit, and the row driving unit includes a capacitor structure; wherein the capacitor structure includes a first capacitive plate, a second capacitive plate and a third capacitive plate, wherein the first capacitive plate is formed in the semiconductor active layer, the second capacitive plate is formed in the first metal layer and the third capacitive plate is formed in the second metal layer and wherein projections of the first capacitive plate and the second capacitive plate on the base substrate are partially overlapped, projections the second capacitive plate and the third capacitive plate on the base substrate are partially overlapped and the third capacitive plate is electrically connected to the first capacitive plate through a first via hole.

Wherein a thickness of a portion of the interayer dielectric layer in the capacitor structure is H1, and a thickness of a portion of the interlayer dielectric layer located outside the capacitor structure is H2, and H1<H2.

Wherein a material of the semiconductor active layer is poly-silicon, a material of each of the gate insulating layer and the interayer dielectric layer is SiOx, SiNx or a combination of SiOx and SiNx, a material of each of the first metal layer and the second metal layer is selected from one or a combination of two or more of Cr, W, Ti, Ta, Mo, Al, and Cu.

Wherein the array substrate further comprises a planarization layer, a third metal layer and a passivation layer which are sequentially disposed on the second metal layer, the capacitor structure further includes a fourth capacitive plate, the fourth capacitive plate is formed in the third metal layer, projections of the fourth capacitive plate and the third capacitive plate on the base substrate are at least partially overlapped and the fourth capacitive plate is electrically connected to the second capacitive plate through the second via hole.

Wherein a material of each of the planarization layer and the passivation layer is SiOx, SiNx or a combination of SiOx and SiNx, a material of the third metal layer is selected from one or a combination of two or more of Cr, W, Ti, Ta, Mo, Al, and Cu.

Wherein the array substrate further comprises a pixel electrode layer disposed on the passivation layer, the capacitor structure further includes a fifth capacitive plate, the fifth capacitive plate is formed in the pixel electrode layer, projections of the fifth capacitive plate and the fourth capacitive plate are on the base substrate are at least partially overlapped and the fifth capacitive plate is electrically connected to the third capacitive plate through a third via hole.

Wherein a thickness of a portion of the passivation layer located in the capacitor structure is H3, a thickness of the passivation layer located outside the capacitor structure is H4, and H3<H4.

Wherein a material of the pixel electrode layer is ITO.

The present invention further provides a liquid crystal panel, comprising: an array substrate and a color filter substrate which are disposed oppositely; a liquid crystal layer disposed between the array substrate and the color filter substrate; wherein the array substrate is the array substrate described above.

The present invention also provides a liquid crystal display device, comprising: a liquid crystal panel and a backlight module, the backlight module provides a display light to the liquid crystal panel such that the liquid crystal panel can display an image, and the liquid crystal panel is the liquid crystal panel described above.

In the array substrate provided in the embodiment of the present invention, two or more capacitors connected in parallel are formed in a row driving unit (GOA), and the areas of the capacitive plates of the capacitor structure can be reduced under the premise of ensuring a sufficiently large capacitance value in the row driving unit. The area occupied by the row driving unit on the array substrate is reduced, which is beneficial to the realization of the narrow frame design of the display device.

DETAILED DESCRIPTION OF PREFERRED EMBODIMENTS

Figure 1:
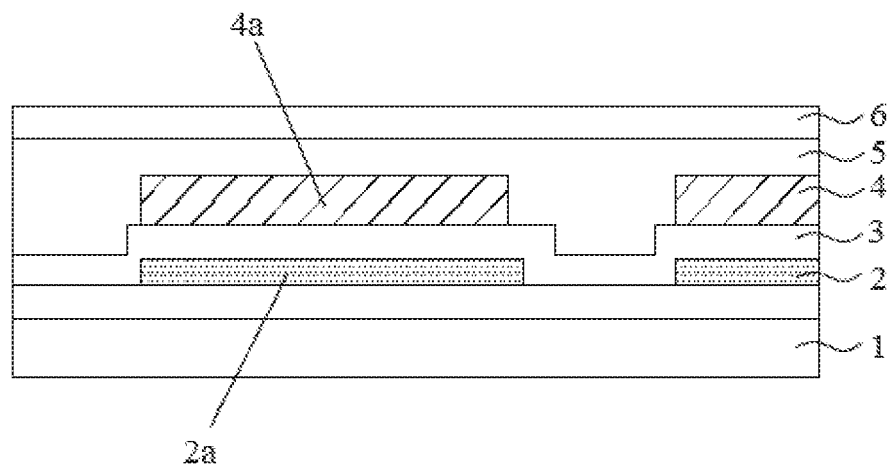
FIG. 1 is a schematic structural diagram of a conventional array substrate.

To make the objectives, technical solutions, and advantages of the present invention clearer, the following describes the specific implementation manners of the present invention in detail with reference to the accompanying drawings. Examples of these preferred embodiments are illustrated in the accompanying drawings. The embodiments of the present invention shown in the drawings and described with reference to the drawings are merely exemplary, and the present invention is not limited to these embodiments.

Here, it should also be noted that, in order to avoid obscuring the present invention due to unnecessary details, only the structures and/or processing steps closely related to the solution according to the present invention are shown in the drawings. The other details of the invention which are not significant are omitted.

Embodiment 1

Figure 2:
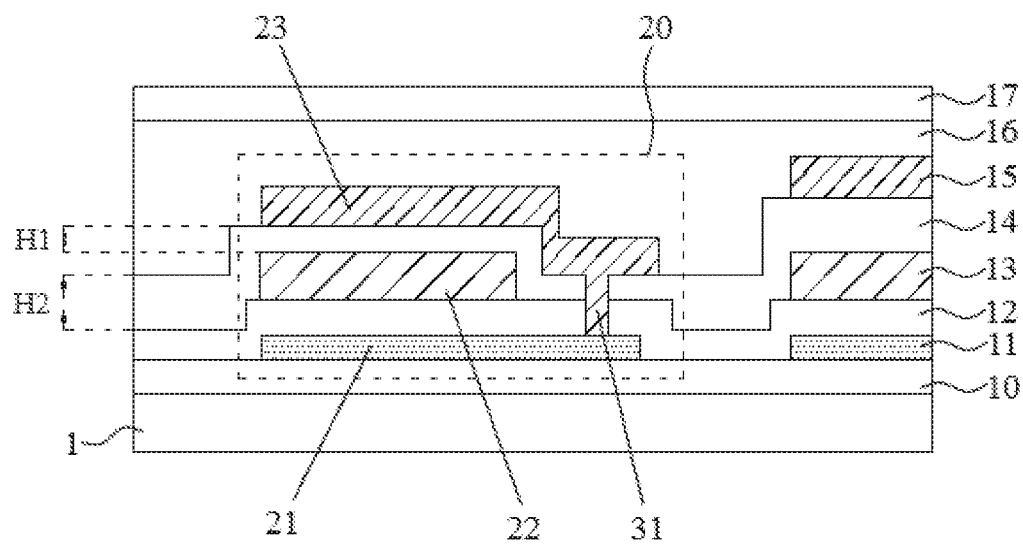
FIG. 2 is a schematic structural diagram of an array substrate according to embodiment 1 of the present invention.

This embodiment provides an array substrate. As shown in FIG. 2, the array substrate includes a semiconductor active layer 11, a gate insulation layer 12, a first metal layer 13, an interlayer dielectric layer 14, a second metal layer 15, a planarization layer 16, and a passivation layer 17 which are sequentially disposed on a base substrate 1. The array substrate is provided with a row driving unit (GOA). Generally, the array substrate includes a display region and a peripheral circuit region located around the periphery of the display region. The row driving unit is disposed in a peripheral circuit region, the row driving unit includes a capacitor structure 20 and a thin-film transistor (not shown in the figure), and a pixel structure (not shown in the figure) is disposed in a display region of the array substrate. Wherein, the capacitor structure 20 and the thin-film transistor of the row driving unit and the pixel structure in the display region are all obtained through a patterning process to pattern the respective material layers on the substrate 1.

The purpose of this embodiment is to reduce the area of the capacitive plate under the premise of ensuring that the capacitor structure 20 has a sufficiently large capacitance value so as to reduce the area occupied by the row driving unit on the array substrate.

Specifically, as shown in FIG. 2, the capacitor structure 20 includes a first capacitive plate 21, a second capacitive plate 22, and a third capacitive plate 23. The first capacitive plate 21 is formed in the semiconductor active layer 11 and by patterning the semiconductor active layer 11 through a patterning process. The second capacitive plate 22 is formed in the first metal layer 13, and is formed by patterning the first metal layer 13 through a patterning process. The third capacitive plate 23 is formed in the second metal layer 15, and is formed by patterning the second metal layer 15 through a patterning process.

Figure 3:
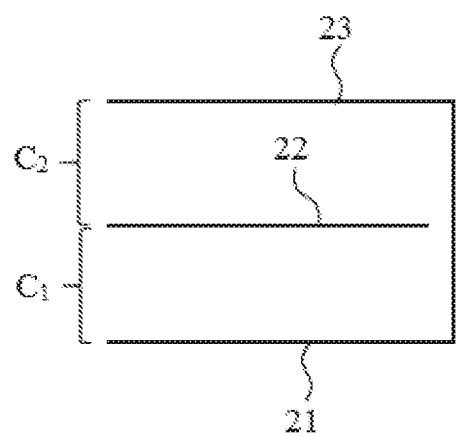
FIG. 3 is an equivalent circuit diagram of a capacitor structure in the array substrate shown FIG. 2.

Here, with reference to FIG. 2 and FIG. 3, FIG. 3 is an equivalent circuit diagram of the capacitor structure 20 as described above. The first capacitive plate 21 and the second capacitive plate 22 are respectively located on opposite sides of the gate insulating layer 12, and projections of the first capacitive plate 21 and the second capacitive plate 22 on the base substrate 1 are partially overlapped. The first capacitive plate 21, the gate insulating layer 12 and the second capacitive plate 22 form a first capacitor C1.

The second capacitive plate 22 and the third capacitive plate 23 are respectively located on opposite sides of the interlayer dielectric layer 14, and projections the second capacitive plate 22 and the third capacitive plate 23 on the base substrate 1 are partially overlapped. The second capacitive plate 22, the interayer dielectric layer 14 and the third capacitor plate 23 form a second capacitor C2. Furthermore, the third capacitive plate 23 is electrically connected to the first capacitive plate 21 through a first via hole 31 such that the first capacitor C1 and the second capacitor C2 are connected in parallel. Specifically, the first via hole 31 penetrates the interlayer dielectric layer 14 and the gate insulating layer 12. When depositing the second metal layer 15, the material of the second metal layer 15 is filled in the first via hole 31 in order to realize that the third capacitive plate 23 and the first capacitive plate 21 are electrically connected to each other.

The capacitor structure 20 provided in the above embodiment includes a first capacitor C1 and a second capacitor C2 connected in parallel with each other, and the capacitance value thereof is C=C1+C2. Comparing to the conventional solution that only one capacitor is provided, when the design requirement of the total capacitance value of the row driving unit is not changed, the area of each capacitive plate of the capacitor structure 20 can be reduced. The area occupied by the row driving unit on the array substrate is reduced, which is beneficial to the narrow frame design of the display device. From another point of view, if the design requirement of the row driving unit is to not change the area of the capacitive plate, the above capacitor structure 20 can obtain a larger capacitance value than the conventional art, thereby improving the signal stability of the output of the row driving unit.

Wherein, the base substrate 1 is usually selected to use a glass substrate. In the present embodiment, a buffer layer 10 is further provided between the base substrate 1 and the semiconductor active layer 11.

Wherein, a material of the semiconductor active layer 11 is poly-silicon.

Wherein, a material of each of the first metal layer 13 and the second metal layer 15 is selected from one or a combination of two or more of Cr, W, Ti, Ta, Mo, Al, and Cu.

A material of each of the gate insulating layer 12, the interayer dielectric layer 14, the planarization layer 16, the passivation layer 17, and the buffer layer 10 can be selected as SiOx or SiNx, or a composite structure layer formed of SiOx and SiNx, respectively.

Furthermore, in this embodiment, as shown in FIG. 1, a thickness of a portion of the interlayer dielectric layer 14 in the capacitor structure 20 is H1, and a thickness of a portion of the interlayer dielectric layer 14 located outside the capacitor structure 20 is H2, and H1<H2. By reducing the portion of the interayer dielectric layer 14 located between the second capacitive plate 22 and the third capacitive plate 23 so as to reduce a gap between the second capacitive plate 22 and the third capacitive plate 23 such that the capacitance value of the second capacitor C2 is increased, thereby further increasing the total capacitance value of the capacitor structure 20.

Embodiment 2

Figure 4:
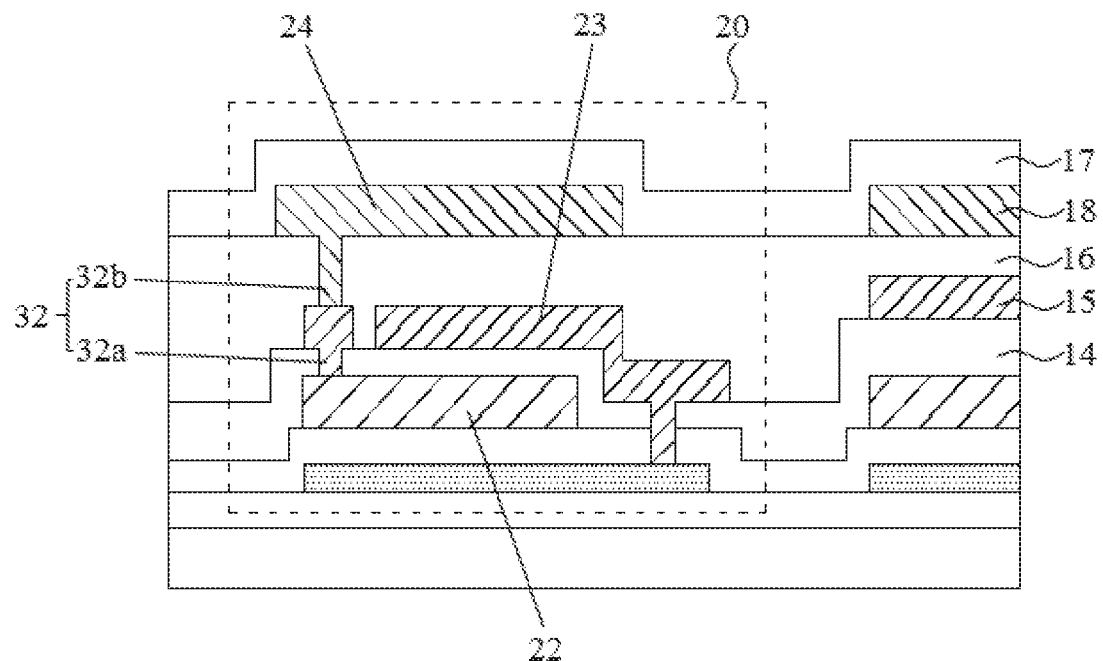
FIG. 4 is a schematic structural diagram of an array substrate according to embodiment 2 of the present invention.

This embodiment provides an array substrate. As shown in FIG. 4, on the basis of the technical solution of Embodiment 1, in the array substrate provided by this embodiment, between the planarization layer 16 and the passivation layer 17, a third metal layer 18 is also provided. Accordingly, the capacitor structure 20 further includes a fourth capacitive plate 24.

Figure 5:
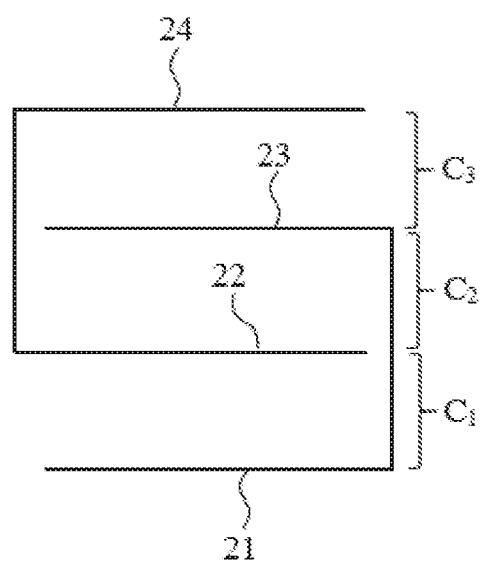
FIG. 5 is an equivalent circuit diagram of a capacitor structure in the array substrate shown in FIG. 4.

Wherein, referring to FIG. 4 and FIG. 5, FIG. 5 is an equivalent circuit diagram of the capacitor structure 20 in this embodiment. The fourth capacitive plate 24 is formed in the third metal layer 18, and specifically, the third metal layer 18 is patterned by a patterning process to form the fourth capacitive plate 24. The fourth capacitive plate 24 and the third capacitive plate 23 are respectively located on opposite sides of the planarization layer 16, and projections of the fourth capacitive plate 24 and the third capacitive plate 23 on the base substrate are at least partially overlapped with each other. The third capacitive plate 23, the planarization layer 16 and the fourth capacitive plate 24 form a third capacitor C3. Furthermore, the fourth capacitive plate 24 is electrically connected to the second capacitive plate 22 through the second via hole 32 to connect the third capacitor C3 and the second capacitor C2 in parallel. Because the third capacitive plate 23 and the first capacitive plate 21 are electrically connected to each other. Therefore, the first capacitor C1, the second capacitor C2, and the third capacitor C3 are parallel to each other.

Specifically, referring to FIG. 4, a first portion 32a of the second via hole 32 penetrates the interlayer dielectric layer 14, and a second portion 32b of the second via hole 32 penetrates the planarization layer 16. When depositing the second metal layer 15, the material of the second metal layer 15 is filled in the first portion 32a of the second via hole 32. When the third metal layer 18 is deposited, the material of the third metal layer 18 is filled in the second portion 32b of the second via hole 32, thereby enabling the fourth capacitive plate 24 and the second capacitive plate 22 to be electrically connected to each other.

Wherein, the material of the third metal layer is selected from one or a combination of two or more of Cr, W, Ti, Ta, Mo, Al, and Cu.

The rest structure in this embodiment is the same as the Embodiment 1, no more repeating.

In this embodiment, the capacitor structure 20 includes a first capacitor C1, a second capacitor C2 and a third capacitor C3 connected in parallel with each other, and the capacitance value thereof is C=C1+C2+C3. Comparing to the Embodiment 1, the present embodiment can obtain a larger total capacitance value, which can further reduce the area of each capacitive plate, reduce the area occupied by the row driving unit on the array substrate, and facilitate the realization of a narrow frame design of the display device.

Embodiment 3

Figure 6:
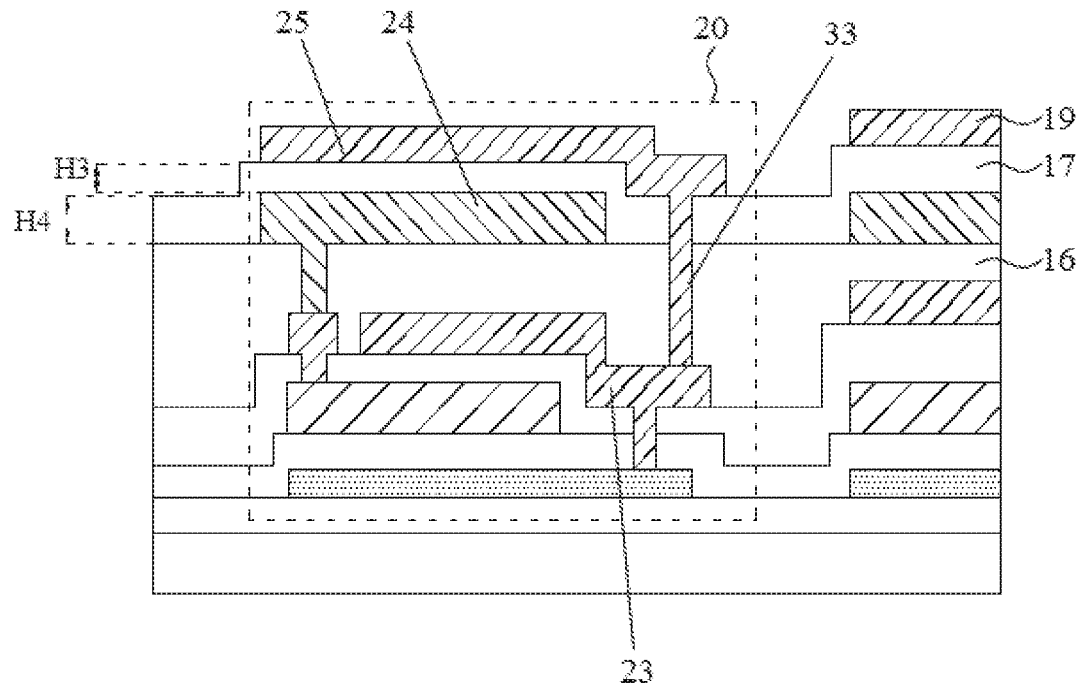
FIG. 6 is a schematic structural diagram of an array substrate according to embodiment 3 of the present invention.

This embodiment provides an array substrate. As shown in FIG. 6, on the basis of the technical solution of the Embodiment 2, in the array substrate provided by this embodiment, a pixel electrode layer 19 is further disposed on the passivation layer 17. Correspondingly, the capacitor structure 20 further includes a fifth capacitive plate 25.

Figure 7:
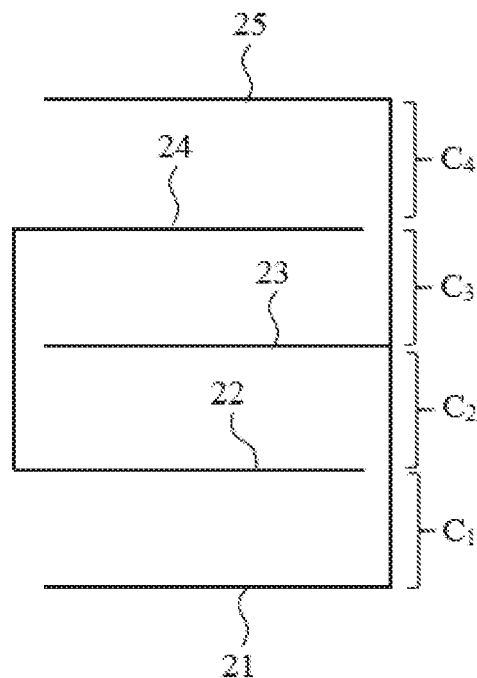
FIG. 7 is an equivalent circuit diagram of a capacitor structure in the array substrate shown in FIG. 6.
Figure 8:
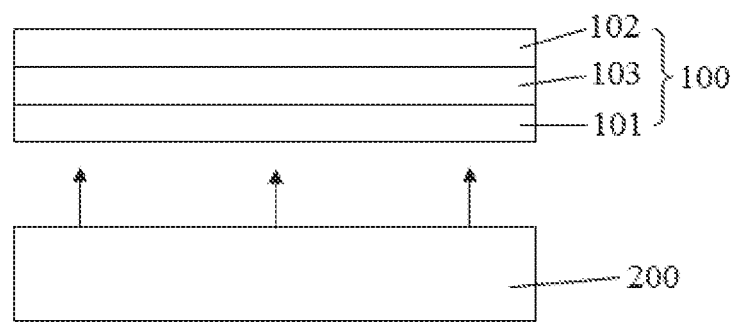
FIG. 8 is a schematic structural diagram of a liquid crystal panel and a liquid crystal display device according to embodiment 4 of the present invention.

Wherein, referring to FIG. 6 and FIG. 7, FIG. 7 is an equivalent circuit diagram of the capacitor structure 20 in this embodiment. The fifth capacitive plate 25 is formed in the pixel electrode layer 19. Specifically, the pixel electrode layer 19 is patterned by a patterning process to form the fifth capacitive plate 25. The fifth capacitive plate 25 and the fourth capacitive plate 24 are respectively located on opposite sides of the passivation layer 17, and projections of the fifth capacitive plate 25 and the fourth capacitive plate 24 are on the base substrate are at least partially overlapped with each other. The fourth capacitive plate 24, the passivation layer 17 and the fifth capacitive plate 25 form a fourth capacitor C4. Further, referring to FIG. 6, the fifth capacitive plate 25 is electrically connected to the third capacitive plate 23 through a third via hole 33 to connect the fourth capacitor C4 and the third capacitor C3 in parallel. The third via hole 33 penetrates the passivation layer 17 and the planarization layer 16, and when the pixel electrode layer 19 is deposited, the material of the pixel electrode layer 19 is filled in the third via hole 33. In this way, the fifth capacitive plate 25 and the third capacitive plate 23 are electrically connected with each other. Furthermore, since the fourth capacitive plate 24 and the second capacitive plate 22 are electrically connected to each other, the third capacitive plate 23 and the first capacitive plate 21 are electrically connected to each other, so that the first capacitor C1 and the second capacitor C2, the third capacitor C3 and the fourth capacitor C4 are three parallel structures.

Wherein, the material of the pixel electrode layer 19 is ITO.

The rest structure in this embodiment is the same as the Embodiment 2, no more repeating.

In this embodiment, the capacitor structure 20 includes a first capacitor C1, a second capacitor C2, a third capacitor C3 and a fourth capacitor C4 connected in parallel with each other. The capacitance value C is C1+C2+C3+C4. Comparing with the Embodiment 2, the present embodiment can obtain a larger total capacitance value, which can further reduce the area of each capacitive plate in the capacitor structure, and reduce the area occupied by the row driving unit on the array substrate.

Further, in this embodiment, as shown in FIG. 6, a thickness of a portion of the passivation layer 17 located in the capacitor structure 20 is H3. A thickness of the passivation layer 17 located outside the capacitor structure 20 is H4, and H3<H4. By reducing the portion of the passivation layer 17 between the fourth capacitive plate 24 and the fifth capacitive plate 25, a gap between the fourth capacitive plate 24 and the fifth capacitive plate 25 is reduced such that the capacitance value of the fourth capacitor C4 is increased, the total capacitance value of the capacitor structure 20 can be further increased.

Embodiment 4

This embodiment firstly provides a liquid crystal panel. As shown in FIG. 4, the liquid crystal panel 100 includes an array substrate 101 and a color filter substrate 102 disposed opposite to each other. A liquid crystal layer 103 is disposed between the array substrate 101 and the filter substrate 102. Wherein, the array substrate 101 is selected from the array substrates provided in the foregoing Embodiments 1 to 3.

Furthermore, the present invention further provides a liquid crystal display device. Referring to FIG. 4, the liquid crystal display device includes the liquid crystal panel 100 and a backlight module 200 as described above, and the liquid crystal panel 100 is opposite to the backlight module 200. According to an embodiment, the liquid crystal panel 100 is disposed on the light emitting surface of the backlight module 200 (the solid arrow in FIG. 4 indicates the light emitted by the backlight module 200), and the backlight module 200 provides a display light source to the liquid crystal panel 100, allowing the liquid crystal panel 100 to display images.

In summary, in the array substrate provided in the embodiment of the present invention, two or more capacitors connected in parallel are formed in a row driving unit (GOA), and the areas of the capacitive plates of the capacitor structure can be reduced under the premise of ensuring a sufficiently large capacitance value in the row driving unit. The area occupied by the row driving unit on the array substrate is reduced, which is beneficial to the realization of the narrow frame design of the display device.

It should be noted that, herein, relational terms such as first and second, and the like are only used to distinguish one entity or operation from another entity or operation. It is not required or implied that these entities or operations exist any such relationship or order between them. Moreover, the terms "comprise," include," or any other variation thereof, are intended to cover a non-exclusive inclusion, such that a series of elements including the process, method, article or device that includes not only those elements but also other elements not expressly listed or further comprising such process, method, article or device inherent elements. Without more constraints, by the statement "comprises one . . . " element defined does not exclude the existence of additional identical elements in the process, method, article, or apparatus.

The above description is only a specific implementation manner of the present application, and it should be noted that for those skilled in the art, a number of improvements and modifications may also be made without departing from the principle of the present application. These improvements and modifications are also possible, and should be considered as the scope of protection of this application.

What is claimed is:

1. An array substrate, comprising:
a semiconductor active layer, a gate insulation layer, a first metal layer, an interlayer dielectric layer, a second metal layer, a planarization layer and a passivation layer which are sequentially disposed on a base substrate;
wherein the array substrate is provided with a row driving unit, and the row driving unit includes a capacitor structure;
wherein the capacitor structure includes a first capacitive plate, a second capacitive plate and a third capacitive plate, wherein the first capacitive plate is formed in the semiconductor active layer made from poly-silicon, the second capacitive plate is formed in the first metal layer and the third capacitive plate is formed in the second metal layer;
wherein projections of the first capacitive plate and the second capacitive plate on the base substrate are partially overlapped, projections the second capacitive plate and the third capacitive plate on the base substrate are partially overlapped and the third capacitive plate is electrically connected to the first capacitive plate through a first via hole;
wherein the first capacitive plate is disposed on atop the base substrate and the second capacitive plate and the third capacitive plate are arranged in sequence above the first capacitive plate;
wherein the array substrate further comprises a third metal layer, and the planarization layer, the third metal layer, and the passivation layer which are sequentially disposed on the second metal layer, and wherein the capacitor structure further includes a fourth capacitive plate, which is formed in the third metal layer, projections of the fourth capacitive plate and the third capacitive plate on the base substrate at least partially overlap; and the fourth capacitive plate is electrically connected to the second capacitive plate through a second via hole;
wherein the array substrate further comprises a pixel electrode layer disposed on the passivation layer, and wherein the capacitor structure further includes a fifth capacitive plate, which is formed in the pixel electrode layer, projections of the fifth capacitive plate and the fourth capacitive plate on the base substrate at least partially overlap, and the fifth capacitive plate is electrically connected to the third capacitive plate through a third via hole;
wherein the planarization layer has a planar top surface, wherein the fourth capacitive plate and the fifth capacitive plate are located above the planar top surface of the planarization layer and the first capacitive plate, the second capacitive plate, and the third capacitive plate are located under the planar top surface of the planarization layer;
wherein each of the gate insulating layer, the interlayer dielectric layer, the planarization layer and the passivation layer is a single layer of SiOx or SiNx, and every two adjacent ones of the first, second, third, fourth and fifth capacitive plates are spaced from each other by a single layer of dielectric material; and wherein the pixel electrode layer comprises a pixel electrode, each of the pixel electrode and the fifth capacitive plate is directly on the passivation layer.

2. The array substrate according to claim 1, wherein a thickness of a portion of the interlayer dielectric layer in the capacitor structure is H1, and a thickness of a portion of the interlayer dielectric layer located outside the capacitor structure is H2, and H1<H2.

3. The array substrate according to claim 1, wherein a material of each of the first metal layer and the second metal layer is selected from one or a combination of two or more of Cr, W, Ti, Ta, Mo, Al, and Cu.

4. The array substrate according to claim 1, wherein material of the third metal layer is selected from one or a combination of two or more of Cr, W, Ti, Ta, Mo, Al, and Cu.

5. The array substrate according to claim 1, wherein a thickness of a portion of the passivation layer located in the capacitor structure is H3, a thickness of the passivation layer located outside the capacitor structure is H4, and H3<H4.

6. A liquid crystal panel, comprising:
an array substrate and a color filter substrate which are disposed oppositely;
a liquid crystal layer disposed between the array substrate and the color filter substrate;
wherein the array substrate comprises:
a semiconductor active layer, a gate insulation layer, a first metal layer, an interlayer dielectric layer, a second metal layer, a planarization layer and a passivation layer which are sequentially disposed on a base substrate;
wherein the array substrate is provided with a row driving unit, and the row driving unit includes a capacitor structure;
wherein the capacitor structure includes a first capacitive plate, a second capacitive plate and a third capacitive plate, wherein the first capacitive plate is formed in the semiconductor active layer made from poly-silicon, the second capacitive plate is formed in the first metal layer and the third capacitive plate is formed in the second metal layer;
wherein projections of the first capacitive plate and the second capacitive plate on the base substrate are partially overlapped, projections the second capacitive plate and the third capacitive plate on the base substrate are partially overlapped and the third capacitive plate is electrically connected to the first capacitive plate through a first via hole;
wherein the first capacitive plate is disposed on atop the base substrate and the second capacitive plate and the third capacitive plate are arranged in sequence above the first capacitive plate;
wherein the array substrate further comprises a third metal layer, and the planarization layer, the third metal layer, and the passivation layer which are sequentially disposed on the second metal layer, and wherein the capacitor structure further includes a fourth capacitive plate, which is formed in the third metal layer, projections of the fourth capacitive plate and the third capacitive plate on the base substrate at least partially overlap; and the fourth capacitive plate is electrically connected to the second capacitive plate through a second via hole;

wherein the array substrate further comprises a pixel electrode layer disposed on the passivation layer, and wherein the capacitor structure further includes a fifth capacitive plate, which is formed in the pixel electrode layer; projections of the fifth capacitive plate and the fourth capacitive plate on the base substrate at least partially overlap; and the fifth capacitive plate is electrically connected to the third capacitive plate through a third via hole;

wherein the planarization layer has a planar top surface, wherein the fourth capacitive plate and the fifth capacitive plate are located above the planar top surface of the planarization layer and the first capacitive plate, the second capacitive plate, and the third capacitive plate are located under the planar top surface of the planarization layer;

wherein each of the gate insulating layer, the interlayer dielectric layer, the planarization layer and the passivation layer is a single layer of SiOx or SiNx, and every two adjacent ones of the first, second, third, fourth and fifth capacitive plates are spaced from each other by a single layer of dielectric material; and wherein the pixel electrode layer comprises a pixel electrode, each of the pixel electrode and the fifth capacitive plate is directly on the passivation layer.

7. The liquid crystal panel according to claim 6, wherein a thickness of a portion of the interlayer dielectric layer in the capacitor structure is H1, and a thickness of a portion of the interlayer dielectric layer located outside the capacitor structure is H2, and H1<H2.

8. The liquid crystal panel according to claim 6, wherein a material of each of the first metal layer and the second metal layer is selected from one or a combination of two or more of Cr, W, Ti, Ta, Mo, Al, and Cu.

9. The liquid crystal panel according to claim 6, wherein a material of the third metal layer is selected from one or a combination of two or more of Cr, W, Ti, Ta, Mo, Al, and Cu.

10. The liquid crystal panel according to claim 6, wherein a thickness of a portion of the passivation layer located in the capacitor structure is H3, a thickness of the passivation layer located outside the capacitor structure is H4, and H3<H4.

11. A liquid crystal display device, comprising:
a liquid crystal panel and a backlight module;
wherein the liquid crystal panel includes an array substrate and a color filter substrate which are disposed oppositely; and a liquid crystal layer disposed between the array substrate and the color filter substrate; and
wherein the array substrate comprises:
a semiconductor active layer, a gate insulation layer, a first metal layer, an interlayer dielectric layer, a second metal layer, a planarization layer and a passivation layer which are sequentially disposed on a base substrate;
wherein the array substrate is provided with a row driving unit, and the row driving unit includes a capacitor structure;
wherein the capacitor structure includes a first capacitive plate, a second capacitive plate and a third capacitive plate, wherein the first capacitive plate is formed in the semiconductor active layer made from poly-silicon, the second capacitive plate is formed in the first metal layer and the third capacitive plate is formed in the second metal layer;
wherein projections of the first capacitive plate and the second capacitive plate on the base substrate are partially overlapped, projections the second capacitive plate and the third capacitive plate on the base substrate are partially overlapped and the third capacitive plate is electrically connected to the first capacitive plate through a first via hole;

wherein the first capacitive plate is disposed on atop the base substrate and the second capacitive plate and the third capacitive plate are arranged in sequence above the first capacitive plate;

wherein the array substrate further comprises a third metal layer, and the planarization layer, the third metal layer, and the passivation layer which are sequentially disposed on the second metal layer, and wherein the capacitor structure further includes a fourth capacitive plate, which is formed in the third metal layer, projections of the fourth capacitive plate and the third capacitive plate on the base substrate at least partially overlap; and the fourth capacitive plate is electrically connected to the second capacitive plate through a second via hole;

wherein the array substrate further comprises a pixel electrode layer disposed on the passivation layer, and wherein the capacitor structure further includes a fifth capacitive plate, which is formed in the pixel electrode layer, projections of the fifth capacitive plate and the fourth capacitive plate on the base substrate at least partially overlap; and the fifth capacitive plate is electrically connected to the third capacitive plate through a third via hole;

wherein the planarization layer has a planar top surface, wherein the fourth capacitive plate and the fifth capacitive plate are located above the planar top surface of the planarization layer and the first capacitive plate, the second capacitive plate, and the third capacitive plate are located under the planar top surface of the planarization layer;

wherein each of the gate insulating layer, the interlayer dielectric layer, the planarization layer and the passivation layer is a single layer of SiOx or SiNx, and every two adjacent ones of the first, second, third, fourth and fifth capacitive plates are spaced from each other by a single layer of dielectric material; and wherein the pixel electrode layer comprises a pixel electrode, each of the pixel electrode and the fifth capacitive plate is directly on the passivation layer.

12. The liquid crystal display device according to claim 11, wherein a thickness of a portion of the interlayer dielectric layer in the capacitor structure is H1, and a thickness of a portion of the interlayer dielectric layer located outside the capacitor structure is H2, and H1<H2.

13. The liquid crystal display device according to claim 11, wherein a material of each of the first metal layer and the second metal layer is selected from one or a combination of two or more of Cr, W, Ti, Ta, Mo, Al, and Cu.

14. The liquid crystal display device according to claim 11, wherein a thickness of a portion of the passivation layer located in the capacitor structure is H3, a thickness of the passivation layer located outside the capacitor structure is H4, and H3<H4.

* * * * *